(12) United States Patent
Huang et al.

(10) Patent No.: US 7,537,356 B2
(45) Date of Patent: May 26, 2009

(54) METHOD FOR IMPROVING COLOR PURITY OF LIGHT SOURCE MODULE AND FLUORESCENT LAMP AND LED DEVICE APPLYING THE METHOD

(75) Inventors: Chun-Yeh Huang, Taoyuan County (TW); Yao-Tung Wang, Taoyuan (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 124 days.

(21) Appl. No.: 11/164,137

(22) Filed: Nov. 11, 2005

(65) Prior Publication Data
US 2007/0115657 A1 May 24, 2007

(51) Int. Cl.
*F21V 9/00* (2006.01)

(52) U.S. Cl. .................. 362/231; 362/800; 362/230; 362/236; 362/240; 362/293

(58) Field of Classification Search .......... 362/231, 362/800, 230, 236, 240, 293
See application file for complete search history.

(56) References Cited

U.S. PATENT DOCUMENTS

| | | | | |
|---|---|---|---|---|
| 3,754,135 | A * | 8/1973 | Hulbert, Jr. | 362/293 |
| 4,173,778 | A * | 11/1979 | Snavely et al. | 362/297 |
| 6,050,704 | A | 4/2000 | Park | 362/260 |
| 2004/0120155 | A1* | 6/2004 | Suenaga | 362/362 |
| 2004/0211927 | A1 | 10/2004 | Schmidt | 250/504 R |
| 2005/0227569 | A1* | 10/2005 | Maeda et al. | 445/25 |
| 2006/0285324 | A1* | 12/2006 | Ansems et al. | 362/231 |

OTHER PUBLICATIONS

Hue-Ming Wang, Enterprise Standardization p. 36, vol. 8, 2004, CN.

* cited by examiner

*Primary Examiner*—Sandra L O'Shea
*Assistant Examiner*—Jessica L McMillan
(74) *Attorney, Agent, or Firm*—Jianq Chyun IP Office

(57) ABSTRACT

A method for improving color purity of a light source module is provided. The light source module includes a light source suitable for emitting color lights with different wavelengths and a transparent cover encapsulating the light source. In the method, a light filtering material is coated on or doped into the transparent cover to absorb part of the color lights with specific wavelengths. Besides, a light source module which adopts the method is provided.

18 Claims, 4 Drawing Sheets

METHOD FOR IMPROVING COLOR PURITY OF LIGHT SOURCE MODULE AND FLUORESCENT LAMP AND LED DEVICE APPLYING THE METHOD

BACKGROUND OF THE INVENTION

1. Field of the Invention

The present invention generally relates to a method for improving color purity and a light source module applying the same. More particularly, the present invention relates to the light source module and the method for improving color purity, which are applied in a display.

2. Description of Related Art

In order to fit the modern life style, visual or image apparatus has become thinner and lighter. Though having some advantages, cathode ray tube (CRT) displays are still marred by their bulky size due to the electron gun and radiation generated during display. Accordingly, combining opto-electronic technology and semiconductor technology, flat panel displays, such as liquid crystal displays (LCDs), organic electro-luminescent (OEL) displays, and plasma display panels (PDPs), have become the mainstream display products in the market.

According to the type of light sources, LCDs are classified into reflective LCDs, transmissive LCDs, and semi-transmissive LCDs. The transmissive LCDs and the semi-transmissive LCDs are composed of liquid crystal panels and backlight modules, wherein the backlight modules serve as a planar light source for the liquid crystal panel to perform the display function.

In general, a light source module, such as a fluorescent lamp or a light emitting diode (LED) package, is adopted to provide light in the backlight module. The light source modules may provide lights with main wavelengths, such as red, green, and blue lights, for the liquid crystal panel to perform the display function. However, it is helpless for the light source module, the fluorescent lamp or the LED package, to produce other lights with improper wavelengths, such as orange and cyan lights, at the same time. Due to the improper color lights of the light source module, color purity of the backlight module is limited, that leads to low color saturation and inferior display quality of the liquid crystal display.

SUMMARY OF THE INVENTION

Accordingly, the purpose of the present invention is to improve color purity of the light source module to obtain high quality light source.

The other purpose of the present invention is to provide a light source module which can output light with high color purity.

With regard to the aforementioned or other purposes, the present invention provides a method for improving color purity of a light source module, wherein the light source module comprises a light source suitable for emitting color lights with different wavelengths and a transparent cover encapsulating the light source, the method comprising coating a light filtering material on the transparent cover or doping the light filtering material into the transparent cover to absorb part of the color lights with specific wavelengths.

In the method for improving color purity of the light source module, the light filtering material may comprise rare-earth elements, such as didymium.

The present invention further provides a light source module comprising a carrier, at least one LED chip, a transparent cover and a light filtering material. The LED chip is disposed on the carrier and suitable for emitting color lights with different wavelengths. The transparent cover is disposed on the carrier and encapsulating the LED chip. The light filtering material is coated on or doped into the transparent cover to absorb part of the color lights with specific wavelengths.

In the light source module, the light filtering material may comprise rare-earth elements, such as didymium.

In the light source module, the transparent cover may comprise a compound disposed on the carrier and at least covering the LED chip. The material of the compound may comprise epoxy resin. Additionally, the light source module may further comprise a fluorescent material doped into the compound.

In the light source module, the carrier may be a frame or a substrate.

The present invention further provides another light source module comprising a hollow transparent tube, a pair of electrodes, a discharging gas, a fluorescent material and a light filtering material. The hollow transparent tube has a discharging space. The electrodes are disposed at two ends of the hollow transparent tube respectively. The discharging gas fills the discharging space. The fluorescent material is coated on the internal surface of the hollow transparent tube, wherein the fluorescent material is suitable for emitting color lights with different wavelength after being excited. The light filtering material is coated on or doped into the hollow transparent tube to absorb part of the color lights with specific wavelengths.

In the other light source module, the light filtering material may comprise rare-earth elements, such as didymium.

In the other light source module, the material of the hollow transparent tube may comprise glass.

Accordingly, the light filtering material is adopted in the present invention to absorb color lights with specific wavelengths, which is emitted from the light source. The light filtering material can be coated on the surface of the transparent cover of the light source module or doped into the transparent cover. Thus, the improper lights emitted from the light source can be eliminated and color purity of the light source module is improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
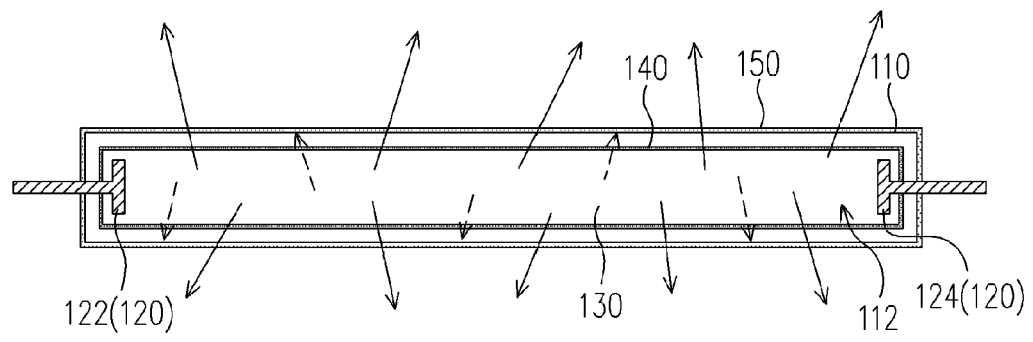
FIG. 1 is a schematic drawing illustrating a fluorescent lamp according to a preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

To clearly and completely explain the method for improving color purity of the light source module, a fluorescent lamp and an LED package being two different types of the light source modules are provided for the illustration. Certainly, one of ordinary skill in the art may apply the method to other types of light source modules within the scope or spirit of the present invention.

FIG. 1 is a schematic drawing illustrating a fluorescent lamp according to a preferred embodiment of the present invention. Referring to FIG. 1, the fluorescent lamp 100 includes a hollow transparent tube 110, a pair of electrodes 120, a discharging gas 130 and a fluorescent material 140. The hollow transparent tube 110 may be a glass tube or the ones made of other transparent materials, which has a discharging space 112. Additionally, the electrodes 120 comprises a anode 122 and a cathode 124, which are disposed at two ends of the hollow transparent tube 110 and electrically connected to a power source (not shown in the drawing).

Referring to FIG. 1, the discharging space 112 is filled with the discharging gas 130, which generally comprises mercury vapour and inert gas. The fluorescent material 140 is coated on the internal surface of the hollow transparent tube 110. By the appropriate voltage applied by the electrodes 120, the discharging gas 130 is excited from a ground state to an excited state. Then, the discharging gas 130 returns back to the ground state and releases energy in the form of UV light, which reacts with the fluorescent material 140 on the internal surface of the hollow transparent tube 110. Accordingly, color lights with different wavelengths as the solid line arrows and the dashed line arrows shown in FIG. 1 are generated to perform the luminescence function.

Figure 2:
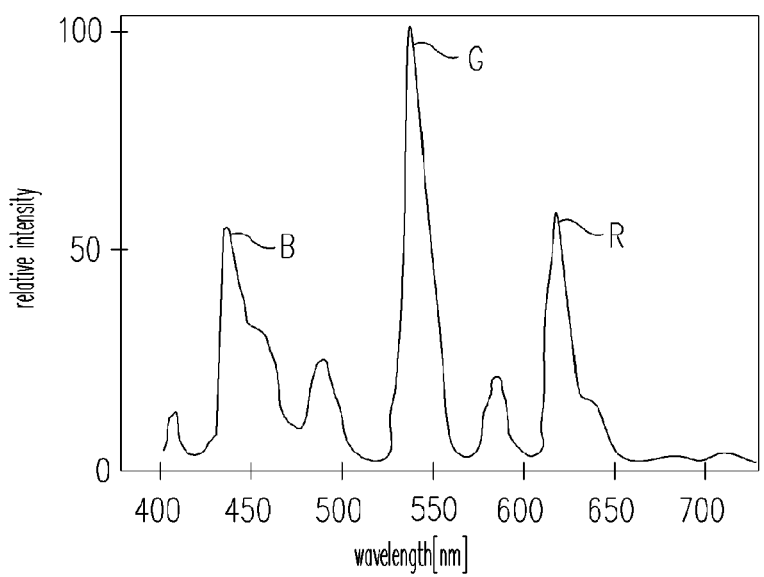
FIG. 2 shows a spectrum of the color lights emitted from a normal white light fluorescent lamp.

FIG. 2 shows a spectrum of the color lights emitted from a normal white light fluorescent lamp, wherein the horizontal axis represents wavelength (nm), and the vertical axis represents relative intensity (%). Referring to FIG. 2, it is noted that there exist other improper color lights near the main color lights, such as red, green, and blue lights. The improper color lights may include orange light with the wavelength from 570 nm to 600 nm and cyan light with the wavelength from 480 nm to 500 nm. Due to the effect of the improper color lights, color purity of the fluorescent lamp degrades.

Referring to FIG. 1, the present invention coats a light filtering material 150 onto the surface of the hollow transparent tube 110, wherein the surface can be the external surface or the internal surface of the hollow transparent tube 110. FIG. 1 illustrates the case that the light filtering material 150 is coated on the external surface of the hollow transparent tube 110. Additionally, the light filtering material 150 may comprise rare-earth elements or other substances capable of absorbing color lights with specific wavelength. In the embodiment, the light filtering material 150 may be didymium, which is capable of absorbing color lights with wavelengths from 480 nm to 500 nm and from 570 nm to 600 nm.

Figure 3:
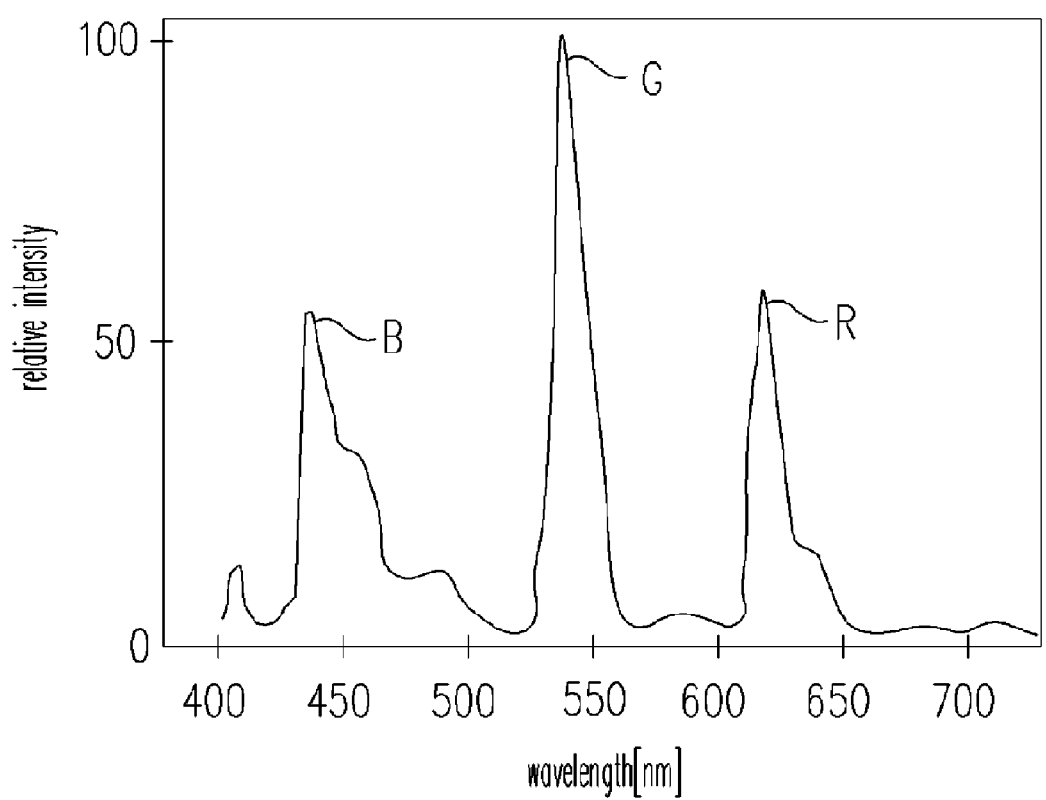
FIG. 3 shows a spectrum of the color lights emitted from a white light fluorescent lamp applying the light filtering material of the present invention.

FIG. 3 shows a spectrum of the color lights emitted from a white light fluorescent lamp applying the light filtering material of the present invention, wherein the horizontal axis represents wavelength (nm), and the vertical axis represents relative intensity (%). Referring to FIG. 3, the light filtering material 150 coated on the external surface of the hollow transparent tube 110 absorbs most the improper color lights with wavelengths from 480 nm to 500 nm and from 570 nm to 600 nm, wherein the intensity of the improper color lights are reduced to 1/10. Therefore, the mix of the main color lights and the improper color lights can be diminished, and color purity of the fluorescent lamp is improved.

Figure 4:
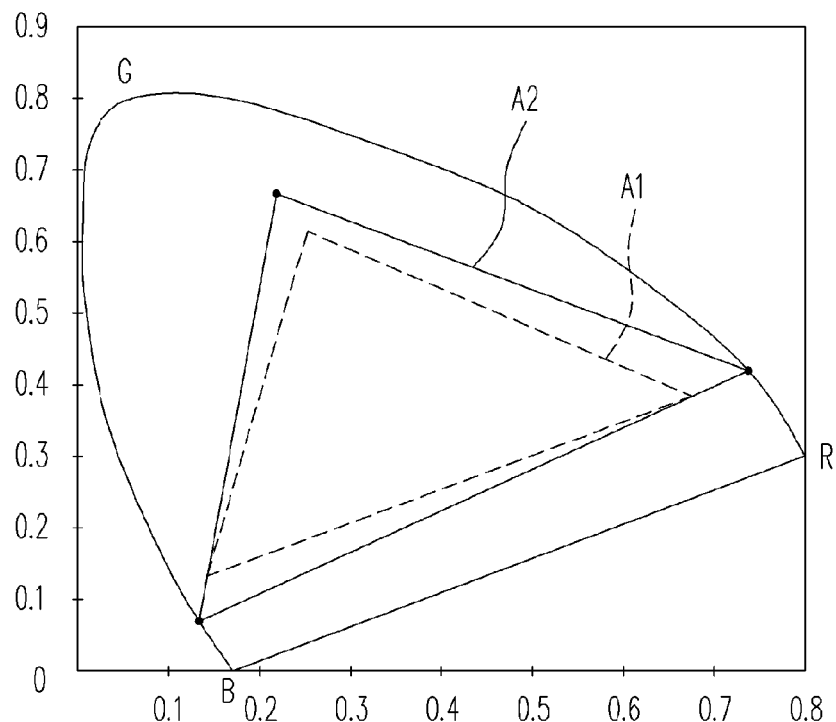
FIG. 4 shows a CIE Chromaticity Diagram of a liquid crystal display adopting the light source module of the present invention.

It should be noted that the aforementioned fluorescent lamp can be applied as the displaying light source of a liquid crystal panel to perform the display function. Comparing to the one adopting the conventional fluorescent lamp, the liquid crystal display adopting the fluorescent lamp of the present invention has much superior color saturation due to the high color purity of the backlight source. FIG. 4 shows a CIE Chromaticity Diagram of a liquid crystal display adopting the light source module of the present invention. Referring to FIG. 4, due to the increase of color purity of the light source module, the NTSC (National Television System Committee) ratio of the liquid crystal display is raised from A1 to A2. Practically, color saturation of the liquid crystal display is enhanced from 72% to 90%.

Figure 5:
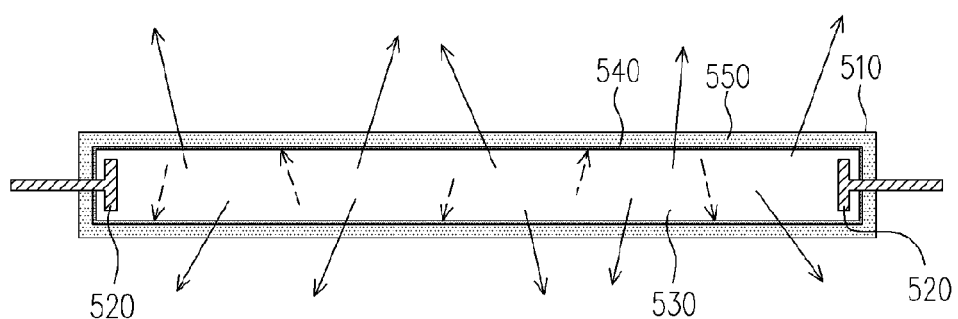
FIG. 5 is a schematic drawing illustrating a fluorescent lamp according to another preferred embodiment of the present invention.

Except coats the fluorescent material on the surface of the hollow transparent lamp, the present invention can further dopes the fluorescent material into the hollow transparent lamp for an identical color filtering effect. FIG. 5 is a schematic drawing illustrating a fluorescent lamp according to another preferred embodiment of the present invention. Referring to FIG. 5, the fluorescent lamp 500 also includes a hollow transparent tube 510, a pair of electrodes 520, a discharging gas 530, a fluorescent material 540 and a light filtering material 550. Since the similar elements have been described in the aforementioned embodiment, the detail arrangement and discussion of the hollow transparent tube 510, the electrodes 520, the discharging gas 530 and the fluorescent material 540 are not repeated here.

It is noted that the light filtering material 550 may be doped into the hollow transparent tube 510 as manufacturing the hollow transparent tube 510 in the present embodiment. The light filtering material 550 may comprise rare-earth elements or other substances capable of absorbing color lights with specific wavelength. In the embodiment, the light filtering material 550 may be didymium, which is capable of absorbing color lights with wavelengths from 480 nm to 500 nm and from 570 nm to 600 nm. Thus, the fluorescent lamp 500 can also provide high color purity.

Figure 6:
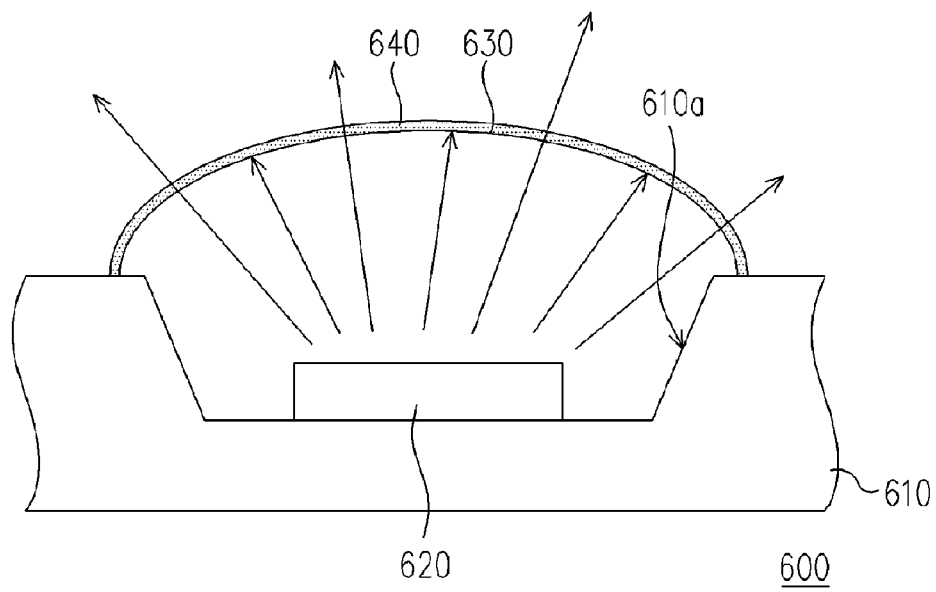
FIG. 6 is a schematic drawing illustrating an LED package according to a preferred embodiment of the present invention.

Except the fluorescent lamps mentioned above, the same manner can further be applied to improve color purity of an LED package. Referring to FIG. 6, which is a schematic drawing illustrating an LED package according to a preferred embodiment of the present invention. The LED package 600 comprises a carrier 610, at least an LED chip 620, a transparent cover 630 and a light filtering material 640. The LED chip 620 is disposed on the carrier 610 and electrically connected to an external power source (not shown in the drawing). Besides, the transparent cover 630 is disposed on the carrier 610 and covers the LED chip 620.

In the present embodiment, the carrier maybe a substrate, and the LED chip 620 is disposed in a cavity 610a of the carrier 610. Additionally, the transparent cover 630 may be compound to encapsulate the LED chip 620 and the transparent cover 630 may made of epoxy resin. Certainly, in other embodiment of the invention, the carrier 610 can be frame or other types of elements. And, the material of the transparent cover 630 can further be changed into glass or other transparent material according to the packaging type of the LED package 600.

According to the known technique, a white light output can be achieved in the present embodiment by one or more LED chip incorporated with a fluorescent material or by the mix of various color lights from different LED chips. In the case of adopting the fluorescent material, the fluorescent material may be doped into the transparent cover 630 and reacts with the light emitted from the LED chip 620 to output color light with various wavelengths as the solid line arrows and the dashed line arrows shown in FIG. 6. It should be noted that the arrangement of the LED chip 620 and the fluorescent material will be different according to the practical situations, and details are not discussed here.

Referring to FIG. 6, the light filtering material 640 is coated on the external surface of the transparent cover 630 to absorb color light with specific wavelengths as the dashed line arrows shown in FIG. 6. The light filtering material 640 may comprise rare-earth elements such as didymium, or other substances capable of absorbing color lights with specific wavelength. According to the spectrum shown in FIG. 2 and 3, the light filtering material 640 is capable of absorbing color lights with wavelengths from 480 nm to 500 nm and from 570 nm to 600 nm to improve color purity of the LED package 600.

Figure 7:
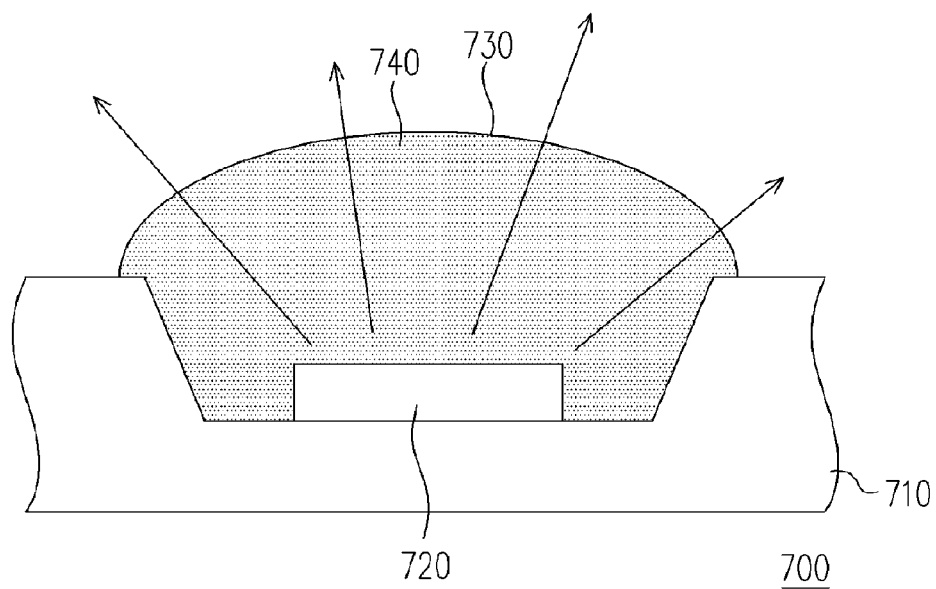
FIG. 7 is a schematic drawing illustrating an LED package according to another preferred embodiment of the present invention.

In another embodiment of the present invention, the light filtering material can be doped into the transparent cover of the LED package to achieve similar filtering effect. FIG. 7 is a schematic drawing illustrating an LED package according to another preferred embodiment of the present invention. Referring to FIG. 7, the LED package 700 comprises a carrier 710, at least an LED chip 720 and a transparent cover 730. The LED chip 620 is disposed on the carrier 610 and electrically connected to an external power source (not shown in the drawing). Besides, the transparent cover 630 is disposed on the carrier 610 and covers the LED chip 620. Since the similar elements have been described in the aforementioned embodiment, the detail arrangement and discussion of the carrier 710, the LED chip 720 and the transparent cover 730 are not repeated here.

Particularly, the light filtering material 740 is doped into the transparent cover 730 as manufacturing the transparent cover 730. The light filtering material 740 may comprise rare-earth elements or other substances capable of absorbing color lights with specific wavelength. In the embodiment, the light filtering material 740 may be didymium, which is capable of absorbing color lights with wavelengths from 480 nm to 500 nm and from 570 nm to 600 nm. Thus, the LED package 700 of the present embodiment can also provide high color purity.

In summary, the light filtering material is coated on the surface of the transparent cover of the light source module or doped into the transparent cover to absorb improper color lights with specific wavelengths, which is emitted from the light source. For example, the present invention can be applied into the fluorescent lamp or the LED package to increase color purity of light emitted from these types of light source modules. Thus, the light source modules can be used to provide backlight for the liquid crystal display, so as to improve color saturation of the liquid crystal display and achieve superior display quality.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for improving color purity of a light source module, wherein the light source module comprises a light source suitable for emitting color lights with different wavelengths and a transparent cover encapsulating the light source, the method comprising coating a light filtering material on the transparent cover or doping the light filtering material into the transparent cover to exclusively absorb part of the color lights with specific wavelengths.

2. The method according to claim 1, wherein the light filtering material comprises rare-earth elements.

3. The method according to claim 2, wherein the light filtering material comprises didymium.

4. The method according to claim 1, wherein the specific wavelengths is between 480 nm and 500 nm and between 570 nm and 600 nm.

5. A light source module, comprising:
a carrier;
at least one LED chip disposed on the carrier and suitable for emitting color lights with different wavelengths;
a transparent cover disposed on the carrier and encapsulating the LED chip; and
a light filtering material coated on or doped into the transparent cover to exclusively absorb part of the color lights with specific wavelengths.

6. The light source module according to claim 5, wherein the light filtering material comprises rare-earth elements.

7. The light source module according to claim 6, wherein the light filtering material comprises didymium.

8. The light source module according to claim 5, wherein the transparent cover comprises a compound disposed on the carrier and at least covering the LED chip.

9. The light source module according to claim 8, further comprising a fluorescent material doped into the compound.

10. The light source module according to claim 8, wherein the material of the compound comprises epoxy resin.

11. The light source module according to claim 5, wherein the carrier comprises a frame.

12. The light source module according to claim 5, wherein the carrier comprises a substrate.

13. The light source module according to claim 5, wherein the specific wavelengths is between 480 nm and 500 nm and between 570 nm and 600 nm.

14. A light source module, comprising:
a hollow transparent tube having a discharging space;
a pair of electrodes disposed at two ends of the hollow transparent tube respectively;
a discharging gas filling the discharging space;
a fluorescent material coated on the internal surface of the hollow transparent tube, wherein the fluorescent material is suitable for emitting color lights with different wavelength after being excited; and
a light filtering material coated on or doped into the hollow transparent tube to exclusively absorb part of the color lights with specific wavelengths.

15. The light source module according to claim 14, wherein the light filtering material comprises rare-earth elements.

16. The light source module according to claim 15, wherein the light filtering material comprises didymium.

17. The light source module according to claim 14, wherein the material of the hollow transparent tube comprises glass.

18. The light source module according to claim 14, wherein the specific wavelengths is between 480 nm and 500 nm and between 570 nm and 600 nm.

* * * * *